United States Patent [19]

McElroy

[11] 4,061,506

[45] Dec. 6, 1977

[54] CORRECTING DOPING DEFECTS

[75] Inventor: David Joal McElroy, Houston, Tex.

[73] Assignee: Texas Instruments Incorporated, Dallas, Tex.

[21] Appl. No.: 573,696

[22] Filed: May 1, 1975

[51] Int. Cl.² .......................................... H01L 21/265
[52] U.S. Cl. .................................... 148/1.5; 148/187; 357/52; 357/91
[58] Field of Search .................... 148/1.5, 187; 357/52, 357/91

[56] References Cited

U.S. PATENT DOCUMENTS

| 3,650,019 | 3/1972 | Robinson | 148/1.5 X |
| 3,789,504 | 2/1974 | Jaddam | 148/187 X |
| 3,880,675 | 4/1975 | Tarui et al. | 148/1.5 |

Primary Examiner—G. Ozaki
Attorney, Agent, or Firm—James T. Comfort; Andrew M. Hassell; John G. Graham

[57] ABSTRACT

A semiconductive device and a method for producing the semiconductive device, wherein random defects or inaccuracies in precise registrations of certain patterns are compensated by the introduction of selected impurities. The selected impurities bring about changes in the electrical characteristics of those portions of the semiconductor affected by the random defects or registration inaccuracies so as to prevent them from causing malfunctions in the completed devices.

22 Claims, 4 Drawing Figures

CORRECTING DOPING DEFECTS

This invention relates to semiconductors and more particularly to semiconductors in which inaccuracies in geometries result in immediate or delayed malfunction.

As is well known to those skilled in the art, successive improvements in semiconductor technologies have resulted in increasing reduction in size of complex semiconductors and to the inclusion within very small geometries of hundreds or thousands of tiny semiconductive components (e.g., bipolar and MOS transistors). As the size of complex semiconductors such as bipolar and MOS integrated circuits has progressively decreased, the criticality of precise delineation of geometries has increased. Moreover, as the number of individual components within one integrated circuit configuration has increased, the necessity for reliable and reproducible manufacturing has correspondingly increased; and in order to achieve acceptable manufacturing yields, it has been necessary to resort to complex and costly manufacturing techniques to insure precise registrations of the necessary masks, diffusions, metallizations and/or other process parameters.

Because, despite improvements in precise geometrical controls, the exceedingly small dimensional sizes of the integrated circuit components has resulted in significant percentages of inoperative units, proposals have been made for increasing yields of finished integrated circuits by testing the operative components within the overall circuits and interconnecting only those which tested favorably. While this has resulted in substantial and effective improvements in manufacturing yields, the incident costs involved have encouraged the continuing search for additional improvements in integrated circuit techniques.

It is one object of the invention to improve dimensions and yields in integrated circuit manufacture.

It is another object of the invention to eliminate or markedly reduce the number of circuits which initially appear sound but which with the passage of time become inoperative.

In accordance with one feature of the invention, degradation of circuit components with the passage of time is markedly reduced or eliminated by introduction of selected impurities into the surface of the integrated circuit at a point near to completion of its processing.

In accordance with another feature of the invention, the introduction of selected impurities in controlled quantities brings about desired changes in the surface states of those portions of the integrated circuit which are undesirably exposed either because of random defects, inaccuracies in geometries and/or registrations of masks employed in their fabrication, or intentionally in order to achieve improvements in other geometries.

In accordance with yet another feature of the invention, the changes in the surface states prevent the always present traces of contamination impurities from altering the electrical characteristics with the passage of time sufficiently to bring about malfunctions of the circuit elements.

In accordance with yet another feature of the invention, the fabrication of the semiconductor components is achieved through a succession of compatible process steps which in cooperative combination with the introduction of the selected impurities results in the production of circuit devices having excellent characteristics and very high yields.

In accordance with an alternative feature of the invention, where it is desirable to identify certain random defects or inaccuracies in semiconductor geometries and/or registrations of masks employed in their fabrication, different impurities are introduced to the surface of the semiconductive device at a point near its completion, whereby the different impurities immediately result in the improper electrical functioning of the parts whose geometries are so defective or misaligned, thereby identifying them at the outset and preventing the misidentification of latently defective units as those whose parameters are good.

These and other objects and features of the invention will be evident from the following detailed description with reference to the drawings in which.

Figure 1:
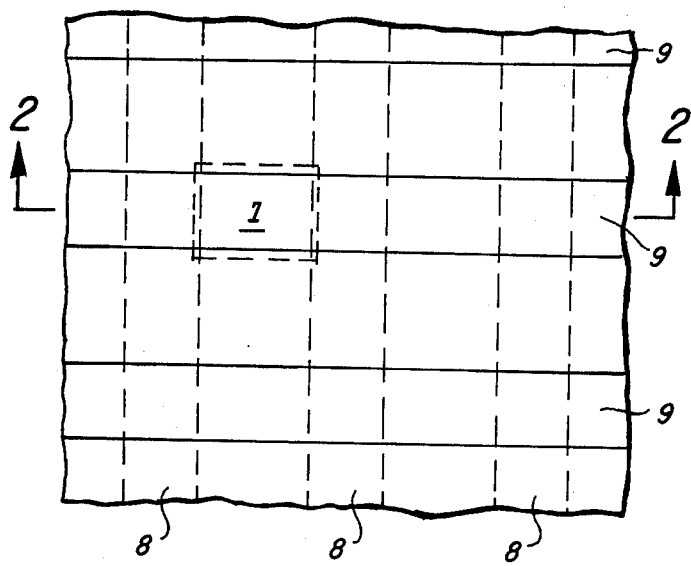
FIG. 1 is a partial plan view of a representative MOS integrated circuit depicting characteristic geometries thereof.

Now turning more specifically to the drawings, it will be observed that FIG. 1 illustrates a portion of a typical metal oxide semiconductor integrated circuit of the type more fully disclosed in U.S. patent application Ser. No. 567,459 filed by R. H. Crawford et al on July 25, 1966 and granted as U.S. Pat. No. 3,541,543 on Nov. 17, 1970. Although such an MOS integrated circuit may contain thousands of individual active elements, only one such element (which in FIG. 1 is identified with the reference numeral 1) has been shown in detail so as not to obscure the description of the invention. Transistor 1 is shown in more detail in the sectional view of FIG. 2 where it is seen to include source 2, drain 3, channel 4, gate 5 and gate insulating layer 6. As the operation of MOS transistors is well known to those skilled in the art and is described in detail in the book entitled "MOSFET in Circuit Design" by Robert H. Crawford, published by McGraw-Hill and copyrighted in 1967 by Texas Instruments Incorporated, and in the book entitled "MOS/LSI Design and Application" by William N. Carr and Jack P. Mize, published by McGraw-Hill and copyrighted in 1972 by Texas Instruments Incorporated, further description of the operative features and characteristics of such devices will be described only in relation to those features which characterize the present invention.

For purposes of illustration, it may be considered that the source and drain are of P-type material and that the main body of the semiconductor wafer 7 is an N-type, thus constituting a P-channel MOS semiconductor device. However, the principles of the invention are applicable to other semiconductors including those of the N-channel variety.

Now turning to FIG. 1, it will be observed that the MOS transistor 1 forms one of many cells of a read-only memory or ROM of conventional type. The ROM is created by a cross matrix of diffused regions 8 and metallization stripes 9. The latter, for the purposes of this illustrative embodiment, may be thin layers of aluminum deposited and patterned by conventional techniques. Electrical connections are made to these thin layers of aluminum as well as to the source and drain areas of the semiconductor by conventional techniques of the type illustrated in the aforementioned patent and at points beyond the margins of the section of the semiconductor wafer illustrated in FIG. 1.

Figure 2:
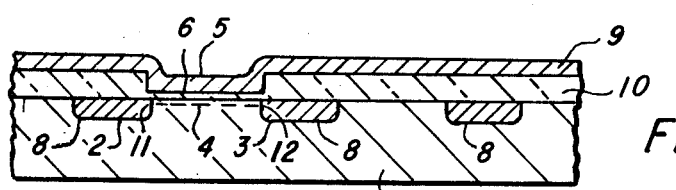
FIG. 2 is a sectional view taken through a section of FIG. 1.

In conventional fabrication of MOS integrated circuits, a thin wafer of semiconductor material of one type conductivity such as that identified by numeral 7 in FIG. 2 is first masked as by a thick oxide layer, and oxide is removed in a pattern to expose only those areas into which conductivity affecting impurities are to be diffused, e.g. regions 8 which provide source and drain 2 and 3. The wafer is then subjected to diffusion of the desired impurities at temperatures suitable for such diffusion and, after the desired penetration and concentrations have been achieved and oxide is regrown over the regions 8, the wafer is removed from the diffusion environment. A surface insulating layer 10, referred to as a field oxide of silicon results from oxide growth and diffusion steps in the process, thus creating a layer of sufficient thickness so that later when the thin layers of metallization are applied, any electric fields developed in normal operation of the devices are insufficient to adversely affect operation of those portions of the semiconductor element other than those where the insulating layer is intentionally thinned as, for example, at the region 6 in FIG. 2.

In the field oxide or thick insulating layer 10, a pattern of thinner portions 6 define the ROM or other circuitry. Conventionally, this is accomplished by masking the wafer to expose only those areas of the field oxide in which thinning is desired. This is done by covering the surface with photoresist, exposing to ultraviolet light through a mask which defines the desired pattern and developing the photoresist. The wafer is then normally etched by suitable etchant until the field oxide material has been removed down to the principal surface of the silicon, using the developed photoresist as a mask. Thereafter, the photoresist is removed and the thin region 6 is prepared either by growth of the oxide at the surface or deposition according to conventional techniques. Upon completion of the thin region 6, the device is ready for metallization which again is accomplished in the conventional manner using photolithographic techniques.

As is well known to those skilled in the art, the proper location of the thinned region 6 is particularly important to the optimum operation of the semiconductive element. If the thinned region extends excessively beyond the projection 11 of the right hand boundary of the diffused region 2 or beyond the left hand boundary 12 of the diffused area 3, excessive capacitances may be introduced between the source 2, drain 3, and gate 5. On the other hand, if the thin region does not extend outwardly as far as projections 11 and 12, then upon application of suitable potential to gate 5, the device may not become turned on and its resistance will be high. Thus, dimensioning in alignment becomes important.

Other reasons are important also for achieving dimensional and geometrical precision. These include minimizing physical sizes of the devices as well as reducing manufacturing tolerances required in mass production.

The creation of the thin insulating region and the application of the metallization are accomplished in successive manufacturing operations which utilize different masks. Unless these masks are precisely aligned, there is the likelihood of a small portion of the thin insulating region remaining uncovered by the thin metal layer. Although manufacturing tolerances may be made sufficient to include some slight overlap when dimensions are precisely aligned, the attending packing density inefficiencies because of overlap renders it imperative that the overlap be kept small. Thus, it has been found that to make the overlap tolerances sufficiently large to compensate for normally encountered inaccuracies in precise mask alignments wastes space in the silicon bar, thus reducing density of circuit functions, increasing costs, and in some cases degrading the final product. It has herefore been found that for economic purposes the tolerances must be restricted sufficiently so that in normal manufacturing processes, a significant percentage of devices are produced having residual exposure of some small portion of the thin insulating area such as is identified at 13 in FIG. 3.

As is known to those skilled in the art, the gate insulator 6 of the insulating material must be sufficiently thin in comparison to the normal thickness of the field oxide 10 so that the electric field created in the underlying semiconductor area brings about conduction across the channel 4 at the desired threshhold voltage of perhaps 2 volts, and yet at the same time does not cause sufficient change in the electrical charge carrier concentration in other portions of the underlying material to result in unwanted activity. It has been found that in order to accomplish this, the thickness of the region 6 must be made so small that ambient impurities, migrating surface charge due to inherent internal voltage gradients, or those which may subsequently find their way to the surface will change its characteristics sufficiently to result in unwanted conduction in the material beneath, unless the entire thin region is covered (as, for example, by gate metallization 9). For this reason, where there is misregistration sufficient to expose a portion 13 of the thin region 6, inoperative devices have resulted, either immediately, or more frequently after an inordinately short life. It is particularly undesirable that a device test good when it comes off the assembly line and then fail after it has been installed or used in end equipment.

It has also been found that during manufacture, certain random defects may appear as, for example, by mask defects and/or the unwanted existence of bubbles in the photoresist. These, or other causes, may result in tiny regions of thin oxide being exposed rather than covered over by the metallization. In such instances, the device may operate defectively either immediately or after an inordinately short life. However, in accordance with the present invention, through the efficacious introduction of selected conductivity-affecting impurities to at least the exposed areas such as 13, sufficient enhancement of the charge carriers is brought about so as to prevent subsequent unwanted surface effects. This is illustrated in FIG. 4.

In certain configuration contemplated by this invention, (as, for example, where maximum packing density is desired) the width of the metallization may be intentionally made less than that of the thin region, thus intentionally exposing portions of the thin regions. In such configurations, the practice of this invention makes it possible to achieve workable and reliable circuits without thickening the oxide layer or resorting to other elaborate surface passivation techniques.

Figure 3:
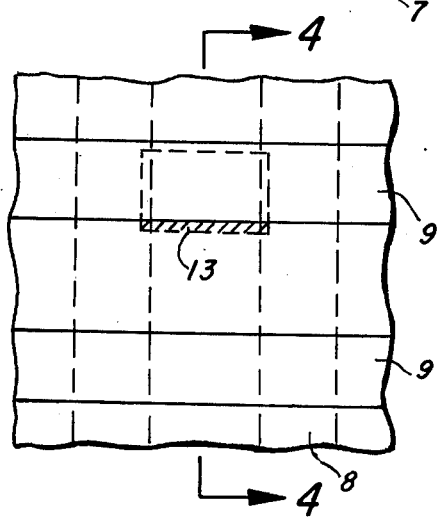
FIG. 3 is an enlarged portion of the illustrative part of FIG. 1 showing in greater detail one of the cells of FIG. 1 and illustrating a misalignment of the gate electrode.
Figure 4:
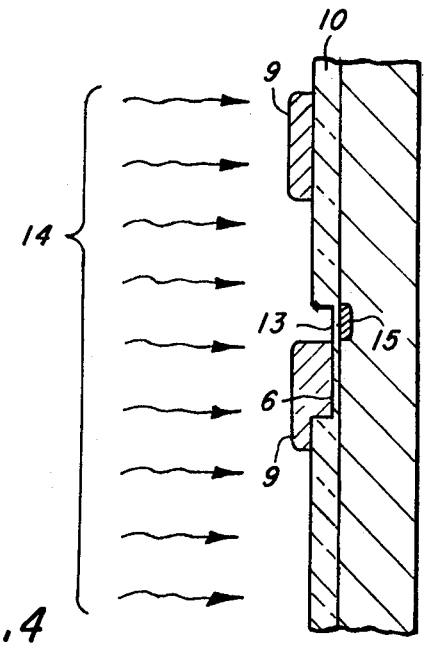
FIG. 4 is a sectional view taken along the section lines 4—4 of FIG. 3.

In FIG. 4, there is a section taken through FIG. 3 showing the misalignment of the metallization and the attendant exposure of surface area 13 of thin insulating material 6. Also shown and depicted by the wavy arrows 14 are the selected conductivity-affecting impurities which are preferably introduced to the surface by ion implantation techniques. These impurities may, in the case of semiconductors having repetitive configurations of elements, be applied to the entire surface. In such instances, metallization and/or thicker insulating material which covers the majority portion of the surface will prevent the conductivity-affecting impurities from adversely changing the electrical characteristics thereof. However, in regions where the critically thin surface areas are exposed, the conductivity-affecting impurities will penetrate through the thin layers sufficiently to cause reinforcement of the underlying conductivity-affecting impurities in the material (shown at 15 in FIG. 4) and thereby prevent subsequent or residually remaining surface impurities or parasitic surface charge within or at the thin layer 13 from adversely affecting the operating characteristics of the device.

An alternative application of the principles of the invention contemplates utilizing impurities of an opposite conductivity-affecting type from those described above. In such instances, degradation of the units is immediate, for such impurities reinforce or add to the adverse affect of the residual or subsequent unwanted impurities in the very thin layers and bring about an immediate malfunction of the units in question. In such instances, only those integrated circuit arrays having no units of sufficient misalignment to expose thin regions will by fully operative.

Although in the embodiment illustrated herein, the metal oxide semiconductor integrated circuit is composed of repetitive configurations of like elements and is so structured that all regions of the surface are sufficiently covered to prevent adverse effects of the finally introduced conductivity-affecting impurities except in cases where sufficient misalignment or lesser metallization width has occurred to expose portions of the thin regions, the principles of the invention are applicable to other integrated circuits where the conductivity-affecting impurities would be restricted to certain portions of the surface only. In such instances, the use of ion implantation is especially efficacious, for such techniques permit the carefully selected application of impurities to precisely delineated portions of the surface only. However, these and other obvious adaptations and applications of the invention will be evident to those skilled in the art.

As one specific example, an n-type 3 to 6 ohm-centimeter, 111 plane, phosphorous doped, two inch diameter silicon wafer of 16 to 18 mils thickness was given an initial brief exposure to conventional acid clean-up. Thereafter, it was placed in a furnace for approximately 20 minutes at a temperature of about 1000° C. until an oxide layer had grown to a thickness of approximately 3,000 angstroms. The wafer was then removed from the furnace. After cooling to room temperature, it was covered with a thin coating (approximately 8,000 angstroms thick) of photoresist material (Eastman Kodak Company type KMER).

The photoresist material was spun on; that is, after application to the surface of the wafer, the wafer was rotated at high speed in order to distribute the resist evenly. Thereupon, it was baked for approximately 15 minutes at a temperature of 60° to 70° C in an inert ($N_2$) atmosphere. A photomask was then positioned adjacent to and over the photoresist covered surface to cover those areas other than where source and drain diffusions were desired. Thereupon, ultraviolet light was directed to the photomask to expose those portions of the photoresist not covered by the mask. After exposure, the photoresist was developed, using KMER developer in which the wafer was immersed for approximately 2 minutes at a temperature of approximately 27° C.

After development and thorough rinsing, photoresist material covered the surface except in those regions where diffusions were desired. The wafer was then hard-baked at approximately 170° C. for about 30 minutes (15 minutes slowrise, 15 minutes at temperature). The wafer was next immersed in what is known in the semiconductor industry as common oxide etch (an acid having the following constituency: 10% by volume of 49% HF in high purity deionized water).

After approximately 4 minutes, the oxide was etched away in the exposed areas, and the wafer was removed from the common oxide etch and thoroughly rinsed in deionized water. It was then immersed in photoresist solvent to remove the remaining photoresist material and was then subjected to an acid cleanup which involved immersion in a solution including $H_2SO_4$ and $H_2O_2$. The wafer was then again thoroughly rinsed in deionized water and air dried, whereupon it was ready for the first diffusion.

The wafer was next introduced into a diffusion furnace and heated to a temperature of 1,050° C. at which time vapor containing boron was introduced to the surface of the wafer during a time of approximately 45 minutes. At the end of the 45 minutes, the boron vapor was discontinued and inert gas (nitrogen) was passed over the wafer as it cooled to room temperature. Inasmuch as over the surface of the wafer a film of boron-silicate glass was formed, the wafer was exposed to hydrogen fluoride vapor for approximately 30 seconds until the boron-silicate glass was volatilized and removed. Thereupon, the wafer was reintroduced to the furnace, heated to approximately 900° C. and then exposed to an oxidizing atmosphere for about 12 hours until over the entire surface of the wafer a thick oxide film of approximately 14,000 angstroms was formed.

After cooling, the wafer was again coated with photoresist material, baked, overlaid with a mask which defined the gate regions and then exposed to ultraviolet light. Next, the photoresist was developed, leaving photoresist material over the entire surface of the wafer except in those regions where the gates were to be formed. At this point, the wafer was again subjected to appropriate etch to remove the oxide except in the exposed regions over the gates. After this was accomplished, the photoresist was removed from the surface by immersing it in photoresist solvent. The wafer was again subjected to acid cleanup (as described above). It then was thoroughly rinsed in deionized water and reintroduced to the furnace where it was heated to 950° C. and exposed to an oxidizing atmosphere (steam) until a gate oxide layer of approximately 1,000 angstroms thickness was formed.

After cooling, the wafer was placed in an ion implant chamber where it was subjected to a beam of boron ions which had been accelerated to a potential of 50 kev. A beam intensity of approximately six microamperes was continued for approximately 10 seconds for a total dose of $3 \times 10^{11}$ per square centimeter after which ion implantation was terminated and the wafer was removed from the implant chamber. It was then again subjected to acid cleanup.

The velocity of the ions and the thickness of the oxide gate layer were interrelated such that the majority of the boron ions passed through the thin oxide layer overlying the gate region and penetrated into the surface of the semiconductor material immediately adjacent thereto. However, the velocity of the boron ions was not sufficient to completely penetrate the much thicker oxide layers which existed over the remainder of the slice.

After the cleanup operations were completed, the slice was reintroduced to the furnace and heated in an inert atmosphere to approximately 900° C. where it remained for approximately 15 minutes. Heating to this level tended to activate the implanted ions by permitting their appropriate distribution throughout the crystal and lattice structure of the semiconductor material.

Next, the wafer was coated with photoresist material, masked, exposed and developed so as to expose for etching only those areas where electrical contacts were to be made thereto. Thereupon, the wafer was reintroduced into etching solution for a sufficient period of time to remove the oxide from the areas where contact was to be made and thereafter the wafer was removed from the etching solution, rinsed and the photoresist material was removed.

Aluminum was then deposited over the entire upper surface, including both the etched areas (for electrical contact) and over the remaining areas still covered with oxide. This was accomplished by using conventional filament-type evaporation at room temperature, with the wafer mounted on a planetary holder. Evaporation/deposition was continued until the thickness of the coating reached approximately one micron. A pattern of photoresist material (using techniques similar to those described above) was then formed on the surface to expose those areas where unwanted metal was to be removed, and the wafer was then immersed in leaching solution to remove the exposed metal. Thereafter, the wafer was thoroughly rinsed in deionized water and dried.

The metal interconnecting pattern and the metallization for the source, drain and gate portions of the active elements on the wafer was now completed. However, in accordance with the features of this invention, the wafer was then introduced into the ion implant chamber and a beam of phosphorous ions of total dose equal to approximately $8 \times 10^{12}$ ions per square centimeter was directed over the entire surface. These ions were accelerated to a potential of approximately 100 kev in order that they would have sufficient velocity to pass through any thin oxide regions which might be exposed on the surface and lodge within or adjacent the interface between the oxide and the underlying semiconductor material. After this had been accomplished, the wafer was removed from the ion implant chamber and was heated to approximately 450° C. in an inert atmosphere for 60 minutes. This tended to permit activation of the implanted ions through migration or relocation within the crystal lattice of the semiconductor material. After this had been accomplished, a protective coating was deposited over the entire surface. This involved a deposition of $Si_3N_4$ at 300° C. until a coating of 3,000 to 4,000 angstroms had been formed. Suitable openings in the silicon nitride coating were then made (using photoresist and masking steps similar to those previously described) to expose metal areas for subsequent bonding.

The wafer was now completed and was subjected to life tests involving operation at elevated temperatures for approximately 1,000 hours. Although some misalignment of masks had been intentionally made in order to expose certain portions of the thin oxide, no failure was encountered within the 1,000 hour period, although in companion slices not subjected to the phosphorous ion implant, failures did occur in the majority of devices within that period of time.

Although the foregoing example illustrated the invention as involving specific materials, times and temperatures, it will be evident to those skilled in the art that other materials, times and temperatures could readily be employed without departing from the scope and principles of the invention. Thus, for example, arsenic, antimony or bismuth ions could be employed instead of phosphorous if the accelerating voltages and beam intensities were adjusted correspondingly. Other modifications and adaptations may occur to those skilled in the art.

The words and expressions employed are intended as terms of description and not of limitation and there is no intention in the use thereof of exluding any equivalents, but on the contrary, it is intended to include any and all equivalents, adaptations and modifications that may be employed without departing from the spirit or scope of the invention.

What is claimed is:

1. In the method of manufacturing semiconductor devices having particular portions determining the operative characteristics thereof, and wherein said method includes the step of precisely locating at least one of said portions with respect to another, the improvement of identifying devices which are latently defective due to excessive misalignment of one or more pair of interrelated regions by introducing selected impurities to those segments which are excessively misaligned, said selected impurities being of a conductivity type effecting electrical characteristics similar to those predominant ambient surface impurities which with the passage of time tend to render the device inoperative by degrading the operating characteristics of those portions of the device which are misaligned, said selected impurities being introduced in quantities sufficient to complete the said degradation but less than sufficient to degrade the operating characteristics of portions which are not misaligned.

2. In the manufacture of semiconductor devices of the type having insulating coatings thereon of various thicknesses and a pattern of metalligation thereon, the step of compensating for misalignment of patterns used in masking steps by subjecting the devices to an ion implantation process after the pattern of metallization has been applied to penetrate the thinnest of the insulating coatings, but not the thicker insulating coatings or metallization.

3. In the method of manufacturing a semiconductor device having particular portions determining the operative characteristics thereof, and wherein said method includes the step of precisely locating at least one of said portions with respect to another, the improvement of compensating for mislocations of said portions by introducing selected impurities to at least those segments of the portions that are mislocated.

4. The method according to claim 3 in which the step of precisely locating said at least one of said portions with respect to said another includes the alignment thereof.

5. The method according to claim 4 in which said impurities are selected from the class consisting of Phosphorus, Arsenic, Antimony and Bismuth.

6. The method according to claim 5 in which said impurities are introduced by ion implantation.

7. The method according to claim 4 in which said impurities are introduced by ion implantation.

8. The method according to claim 4 in which said mislocations of said portions are misalignments and in which the introduction of selected impurities is to at least those segments of the portions that are misaligned.

9. The method according to claim 8 in which said impurities are selected from the class consisting of Phosphorus, Arsenic, Antimony and Bismuth.

10. The method according to claim 9 in which said impurities are introduced by ion implantation.

11. The method according to claim 8 in which said impurities are introduced by ion implantation.

12. The method according to claim 3 in which the introduction of selected impurities is additionally made to other portions of the exterior of the semiconductor device.

13. The method according to claim 12 in which said impurities are selected from the class consisting of Phosphorus, Arsenic, Antimony and Bismuth.

14. The method according to claim 13 in which said impurities are introduced by ion implantation.

15. The method according to claim 12 in which said impurities are introduced by ion implantation.

16. The method according to claim 12 in which the introduction of the selected impurities is made to the entire operative exterior of the semiconductor device.

17. The method according to claim 16 in which said impurities are selected from the class consisting of Phosphorus, Arsenic, Antimony and Bismuth.

18. The method according to claim 17 in which said impurities are introduced by ion implantation.

19. The method according to claim 16 in which said impurities are introduced by ion implantation.

20. The method according to claim 3 in which said impurities are selected from the class consisting of Phosphorous, Arsenic, Antimony and Bismuth.

21. The method according to claim 20 in which said impurities are introduced by ion implantation.

22. The method according to claim 3 in which said impurities are introduced by ion implantation.

* * * * *